(12) United States Patent
Okazawa et al.

(10) Patent No.: US 11,587,805 B2
(45) Date of Patent: Feb. 21, 2023

(54) SUBSTRATE PROCESSING APPARATUS AND SUBSTRATE PROCESSING METHOD

(71) Applicant: TOKYO ELECTRON LIMITED, Tokyo (JP)

(72) Inventors: Tomoki Okazawa, Koshi Kumamoto (JP); Katsunori Ichino, Koshi Kumamoto (JP); Masanobu Watanabe, Koshi Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 255 days.

(21) Appl. No.: 16/897,602

(22) Filed: Jun. 10, 2020

(65) Prior Publication Data

US 2020/0395227 A1    Dec. 17, 2020

(30) Foreign Application Priority Data

Jun. 11, 2019  (JP) .............................. JP2019-108790

(51) Int. Cl.
  *H01L 21/67*    (2006.01)
  *B05B 1/02*    (2006.01)

(52) U.S. Cl.
  CPC ............ *H01L 21/6715* (2013.01); *B05B 1/02* (2013.01)

(58) Field of Classification Search
  CPC ........... H01L 21/6715; H01L 21/67253; H01L 21/67178; H01L 21/0271; H01L 21/027; H01L 21/68764; B05B 1/02; B05B 13/0228; B05B 12/087; B05D 1/005; G03F 7/162
  See application file for complete search history.

(56) References Cited

U.S. PATENT DOCUMENTS

2002/0176928 A1* 11/2002 Minami ............ H01L 21/67253
                                                              427/8
2015/0352587 A1* 12/2015 Ichino .................. B05C 11/1002
                                                              427/286

FOREIGN PATENT DOCUMENTS

JP         2005-46694 A     2/2005

* cited by examiner

*Primary Examiner* — Syed I Gheyas
(74) *Attorney, Agent, or Firm* — Nath, Goldberg & Meyer; Jerald L. Meyer; Tanya E. Harkins

(57) ABSTRACT

A substrate processing apparatus includes: a rotary holder configured to hold and rotate a substrate; a liquid supplier including a nozzle that ejects a processing liquid; a driver configured to move the nozzle between a center of the substrate and a peripheral portion of the substrate; and a controller configured to: execute a supply control to supply the processing liquid to the surface of the substrate so as to form a supply trajectory in a spiral shape, by ejecting the processing liquid from the nozzle while rotating the substrate and moving the nozzle from the center of the substrate toward the peripheral portion of the substrate; and when executing the supply control, gradually reduce an ejection amount of the processing liquid per unit area on the surface of the substrate, at least in a portion forming an outermost periphery of the supply trajectory.

11 Claims, 10 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-108790, filed on Jun. 11, 2019, the entire contents of which are incorporated herein by reference.

TECHNICAL FIELD

The present disclosure relates to a substrate processing apparatus and a substrate processing method.

BACKGROUND

Patent Document 1 discloses a coating apparatus (a substrate processing apparatus) including a rotation movement mechanism that rotates a substrate supporter together with a substrate, a nozzle that supplies a coating liquid onto a target surface of the rotating substrate, and a horizontal movement mechanism that horizontally moves the nozzle. In this substrate processing apparatus, the coating liquid is spirally applied to the target surface of the substrate.

PRIOR ART DOCUMENT

Patent Document

Patent Document 1: Japanese laid-open publication No. 2005-46694

SUMMARY

A substrate processing apparatus according to an aspect of the present disclosure includes: a rotary holder configured to hold and rotate a substrate; a liquid supplier including a nozzle that ejects a processing liquid, and configured to supply the processing liquid to a surface of the substrate held by the rotary holder; a driver configured to move the nozzle between a center of the substrate and a peripheral portion of the substrate; and a controller configured to control the rotary holder, the liquid supplier, and the driver. The controller is further configured to: execute a supply control to supply the processing liquid to the surface of the substrate so as to form a supply trajectory in a spiral shape, by ejecting the processing liquid from the nozzle while rotating the substrate and moving the nozzle from the center of the substrate toward the peripheral portion of the substrate; and when executing the supply control, gradually reduce an ejection amount of the processing liquid per unit area on the surface of the substrate, at least in a portion forming an outermost periphery of the supply trajectory.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
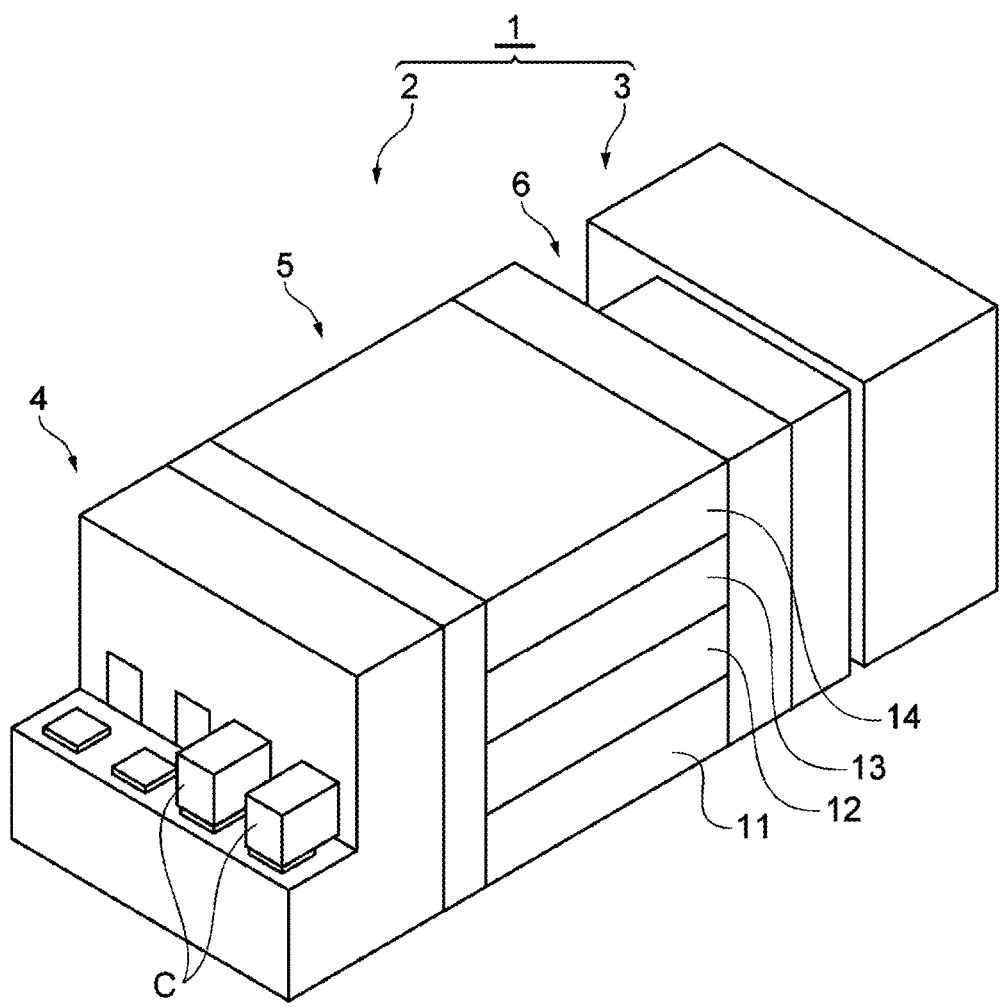
FIG. 1 is a schematic view illustrating an example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described.

A substrate processing apparatus according to an aspect of the present disclosure includes a rotary holder configured to hold and rotate a substrate; a liquid supplier including a nozzle that ejects a processing liquid, and configured to supply the processing liquid to a surface of the substrate held by the rotary holder; a driver configured to move the nozzle between a center of the substrate and a peripheral portion of the substrate; and a controller configured to control the rotary holder, the liquid supplier, and the driver. The controller is further configured to: execute a supply control to supply the processing liquid to the surface of the substrate so as to form a supply trajectory in a spiral shape, by ejecting the processing liquid from the nozzle while rotating the substrate and moving the nozzle from the center of the substrate toward the peripheral portion of the substrate; and when executing the supply control, gradually reduce an ejection amount of the processing liquid per unit area on the surface of the substrate, at least in a portion forming an outermost periphery of the supply trajectory.

In this substrate processing apparatus, the processing liquid is supplied to the surface of the substrate in the spiral shape. When the processing liquid is supplied in the spiral shape from the center of the substrate in a state in which the ejection amount of the processing liquid per unit area is maintained substantially constant, a difference in the amount of the processing liquid supplied to the surface of the substrate occurs in the vicinity of the outermost periphery according to a location in the circumferential direction. Thus, a difference in film thickness may occur. In contrast, in the above configuration, since the ejection amount per unit area on the surface of the substrate gradually decreases in the portion forming the outermost periphery of the supply trajectory, the difference in the ejection amount in the circumferential direction of the substrate is reduced. As a result, since the difference in the film thickness in the circumferential direction is reduced at least in the vicinity of the outermost periphery, it is possible to improve thickness uniformity of a film formed on the surface of the substrate.

When executing the supply control, the controller may gradually reduce the ejection amount of the processing liquid per unit time from the nozzle, at least in the portion forming the outermost periphery. In this case, since it is possible to adjust the ejection amount of the processing liquid by adjusting a flow rate of the processing liquid delivered to the nozzle, it is easy to reduce the ejection amount of the processing liquid per unit area on the surface of the substrate.

The liquid supplier may include a flow path configured to guide the processing liquid to the nozzle, and a valve configured to switch an opening state of the flow path. When executing the supply control, the controller may gradually change the flow path from an opened state to a closed state using the valve in a portion forming an end portion including an end point in the supply trajectory. In this case, a rapid increase in the ejection amount of the processing liquid accompanying the closing operation of the valve is suppressed. As a result, it is possible to further improve the thickness uniformity of the film formed on the surface of the substrate.

The liquid supplier may include a tank connected to the nozzle via the flow path and storing the processing liquid, and a pressure adjustor configured to adjust a pressure in the tank. When executing the supply control, the controller may gradually reduce the ejection amount of the processing liquid per unit time from the nozzle, by gradually reducing the pressure in the tank at least in the portion forming the outermost periphery. In this case, since the ejection amount of the processing liquid can be adjusted separately from the opening and closing control of the valve, it is easy to gradually reduce the ejection amount.

When executing the supply control, the controller may gradually reduce the ejection amount of the processing liquid per unit area on the surface of the substrate, from a location preceding the portion forming the outermost periphery of the supply trajectory. In this case, since adjusting the ejection amount of the processing liquid in the vicinity of the outermost periphery is performed from a location preceding the outermost periphery, it is possible to more reliably reduce the difference in film thickness in the circumferential direction, at least in the vicinity of the outermost periphery.

The viscosity of the processing liquid may be 300 cP or more. Since a processing liquid having a high viscosity has low fluidity, a supply amount of the processing liquid supplied to the substrate in the spiral shape greatly affects the film thickness. By using the above-described control when supplying the processing liquid having such a high viscosity to the substrate, it is possible to improve the thickness uniformity of the film formed from the processing liquid.

A substrate processing method according to another aspect of the present disclosure includes supplying a processing liquid to a surface of a substrate so as to form a supply trajectory in a spiral shape, by ejecting the processing liquid from a nozzle while rotating the substrate and moving the nozzle from a center of the substrate to a peripheral portion of the substrate. The supplying the processing liquid includes gradually reducing the ejection amount of the processing liquid per unit area on the surface of the substrate, at least in a portion forming the outermost periphery of the supply trajectory.

Hereinafter, various exemplary embodiments will be described in detail with reference to the drawings. In the description, the same elements or elements having the same function will be denoted by the same reference numerals, and a redundant description will be omitted.

[Substrate Processing System]

Figure 2:
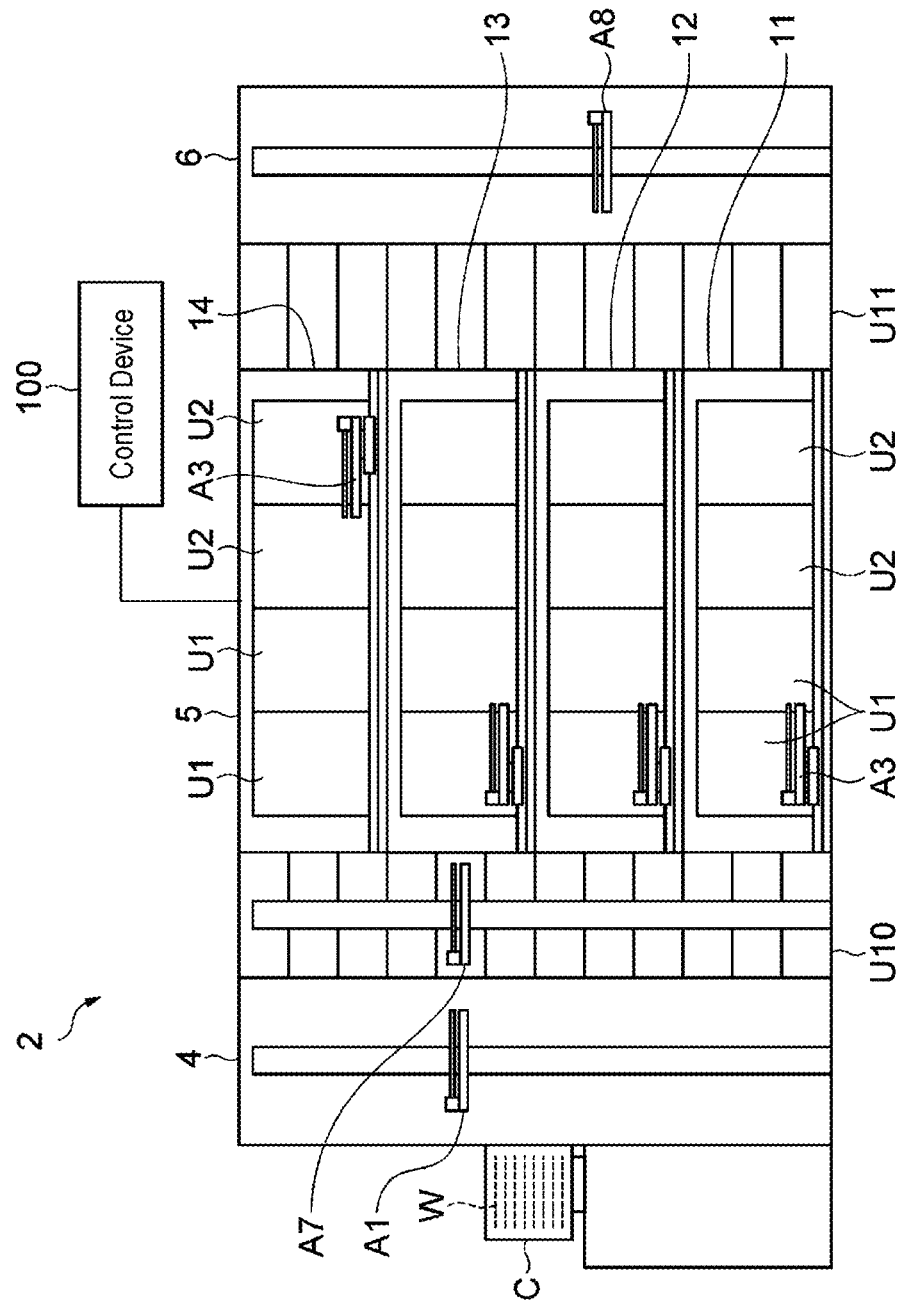
FIG. 2 is a schematic view illustrating an example of a coating and development apparatus.

First, a schematic configuration of a substrate processing system will be described with reference to FIGS. 1 and 2. A substrate processing system 1 is a system for forming a photosensitive film on a substrate, exposing the photosensitive film, and developing the photosensitive film. A substrate as a processing target is, for example, a semiconductor wafer W. The photosensitive film is, for example, a resist film. The substrate processing system 1 includes a coating and development apparatus 2 and an exposure apparatus 3. The exposure apparatus 3 performs an exposure process of the resist film (photosensitive film) formed on the wafer W (substrate). Specifically, the exposure apparatus 3 irradiates an exposure target portion of the resist film with an energy beam by, for example, a liquid immersion exposure method. The coating and development apparatus 2 performs a resist film formation process on the surface of the wafer W (substrate) before the exposure process is performed by the exposure apparatus 3, and performs a resist film development process after the exposure process.

[Substrate Processing Apparatus]

Hereinafter, configuration of the coating and development apparatus 2 will be described as an example of the substrate processing apparatus. As illustrated in FIGS. 1 and 2, the coating and development apparatus 2 includes a carrier block 4, a processing block 5, an interface block 6, and a control device (controller) 100.

The carrier block 4 performs loading a wafer W into the coating and development apparatus 2 and unloading the wafer W from the coating and development apparatus 2. For example, the carrier block 4 is capable of supporting a plurality of carriers C for wafers W, and incorporates a transfer device A1 including a transfer arm. Each carrier C accommodates, for example, a plurality of circular wafers W. The transfer device A1 takes wafers W out of the carriers C to transfer the wafers W to the processing block 5, and receives wafers W from the processing block 5 to return the wafers W into the carriers C.

The processing block 5 has a plurality of processing modules 11, 12, 13, and 14. Each of the processing modules 11, 12, 13, and 14 incorporates liquid processing units U1, heat treatment units U2, and a transfer device A3 including a transfer arm for transferring wafers W to these units. Each of the liquid processing units U1 performs a liquid process by supplying a processing liquid to the surface of the wafer W. Each of the heat treatment units U2 incorporates, for example, a hot plate and a cooling plate, and performs a heat treatment by heating the wafer W with the hot plate and cooling the heated wafer W with the cooling plate.

The processing module 11 forms a lower layer film on the surface of the wafer W using the liquid processing unit U1 and the heat treatment unit U2. The liquid processing unit U1 of the processing module 11 applies a processing liquid for forming the lower layer film on the wafer W. The heat treatment unit U2 of the processing module 11 performs various heat treatments following the formation of the lower layer film.

The processing module 12 forms the resist film on the lower layer film using the liquid processing unit U1 and the heat treatment unit U2. The liquid processing unit U1 of the processing module 12 applies a processing liquid for forming the resist film on the lower layer film. The heat treatment unit U2 of the processing module 12 performs various heat treatments following the formation of the resist film. A specific example of the heat treatments includes a heat treatment for curing a coating film to form the resist film (pre applied bake (PAB)).

The processing module 13 forms an upper layer film on the resist film using the liquid processing unit U1 and the heat treatment unit U2. The liquid processing unit U1 of the processing module 13 applies a liquid for forming the upper layer film on the resist film. The heat treatment unit U2 of the processing module 13 performs various heat treatments following the formation of the upper layer film.

The processing module 14 performs a development process on the resist film after an exposure process using the liquid processing unit U1 and the heat treatment unit U2. The liquid processing unit U1 of the processing module 14 performs the development process on the resist film by applying a developing liquid on the surface of the wafer W having been subjected to the exposure process and then rinsing the developing liquid using a rinsing liquid. The heat treatment unit U2 performs various heat treatments following the development process. Specific examples of the heat treatments include a heating process before the development process (post exposure bake (PEB)), a heating process after the development process (post bake (PB)), and the like.

A shelf unit U10 is provided on the carrier block 4 side in the processing block 5. The shelf unit U10 is partitioned into a plurality of vertically arranged cells. A transfer device A7 including a lifting arm is provided in the vicinity of the shelf unit U10. The transfer device A7 moves the wafer W up and down among the cells of the shelf unit U10.

A shelf unit U11 is provided on the interface block 6 side in the processing block 5. The shelf unit U11 is partitioned into a plurality of vertically arranged cells.

The interface block 6 performs delivery of the wafer W to and from the exposure apparatus 3. For example, the interface block 6 incorporates a transfer device A8 including a transfer arm, and is connected to the exposure apparatus 3. The transfer device A8 delivers a wafer W placed on the shelf unit U11 to the exposure apparatus 3, and receives a wafer W from the exposure apparatus 3 to return the wafer to the shelf unit U11.

[Procedure of Coating and Development Process]

The control device 100 controls the coating and development apparatus 2 to execute a coating and developing process, as in the following example. First, the control device 100 controls the transfer device A1 to transfer a wafer W in the carrier C to the shelf unit U10, and controls the transfer device A7 to arrange the wafer W in a cell for the processing module 11.

Subsequently, the control device 100 controls the transfer device A3 to transfer the wafer W in the shelf unit U10 to the liquid processing unit U1 and the heat treatment unit U2 in the processing module 11. Further, the control device 100 controls the liquid processing unit U1 and the heat treatment unit U2 so as to form the lower layer film on the surface of the wafer W. Thereafter, the control device 100 controls the transfer device A3 to return the wafer W on which the lower layer film is formed to the shelf unit U10, and controls the transfer device A7 to arrange the wafer W in a cell for the processing module 12.

Subsequently, the control device 100 controls the transfer device A3 to transfer the wafer W of the shelf unit U10 to the liquid processing unit U1 and the heat treatment unit U2 in the processing module 12. Further, the control device 100 controls the liquid processing unit U1 and the heat treatment unit U2 so as to form the resist film on the surface of the wafer W. Thereafter, the control device 100 controls the transfer device A3 to return the wafer W to the shelf unit U10, and controls the transfer device A7 to arrange the wafer W in a cell for the processing module 13.

Subsequently, the control device 100 controls the transfer device A3 to transfer the wafer W in the shelf unit U10 to the liquid processing unit U1 and the heat treatment unit U2 in the processing module 13. Further, the control device 100 controls the liquid processing unit U1 and the heat treatment unit U2 so as to form an upper layer film on the resist film of the wafer W. Thereafter, the control device 100 controls the transfer device A3 to transfer the wafer W to shelf unit U11.

Subsequently, the control device 100 controls the transfer device A8 so as to deliver the wafer W in the shelf unit U11 to the exposure apparatus 3. Thereafter, the control device 100 controls the transfer device A8 to receive a wafer W having been subjected to the exposure process from the exposure apparatus 3 and arrange the wafer W in a cell for the processing module 14 in the shelf unit U11.

Subsequently, the control device 100 controls the transfer device A3 to transfer the wafer W of the shelf unit U11 to the liquid processing unit U1 and the heat treatment unit U2 in the processing module 14, and controls the liquid processing unit U1 and the heat treatment unit U2 to perform the development process on the resist film of the wafer W. Thereafter, the control device 100 controls the transfer device A3 to return the wafer W to the shelf unit U10, and controls the transfer device A7 and the transfer device A1 to return the wafer W to the carrier C. Thus, the coating and development process is completed.

The specific configuration of the substrate processing apparatus is not limited to the configuration of the coating and development apparatus 2 described above. The substrate processing apparatus may be of any type of apparatus including a liquid processing unit configured to supply a processing liquid to a substrate to perform a liquid process, and a control device 100 configured to control the liquid processing unit.

(Liquid Processing Unit)

Figure 3:
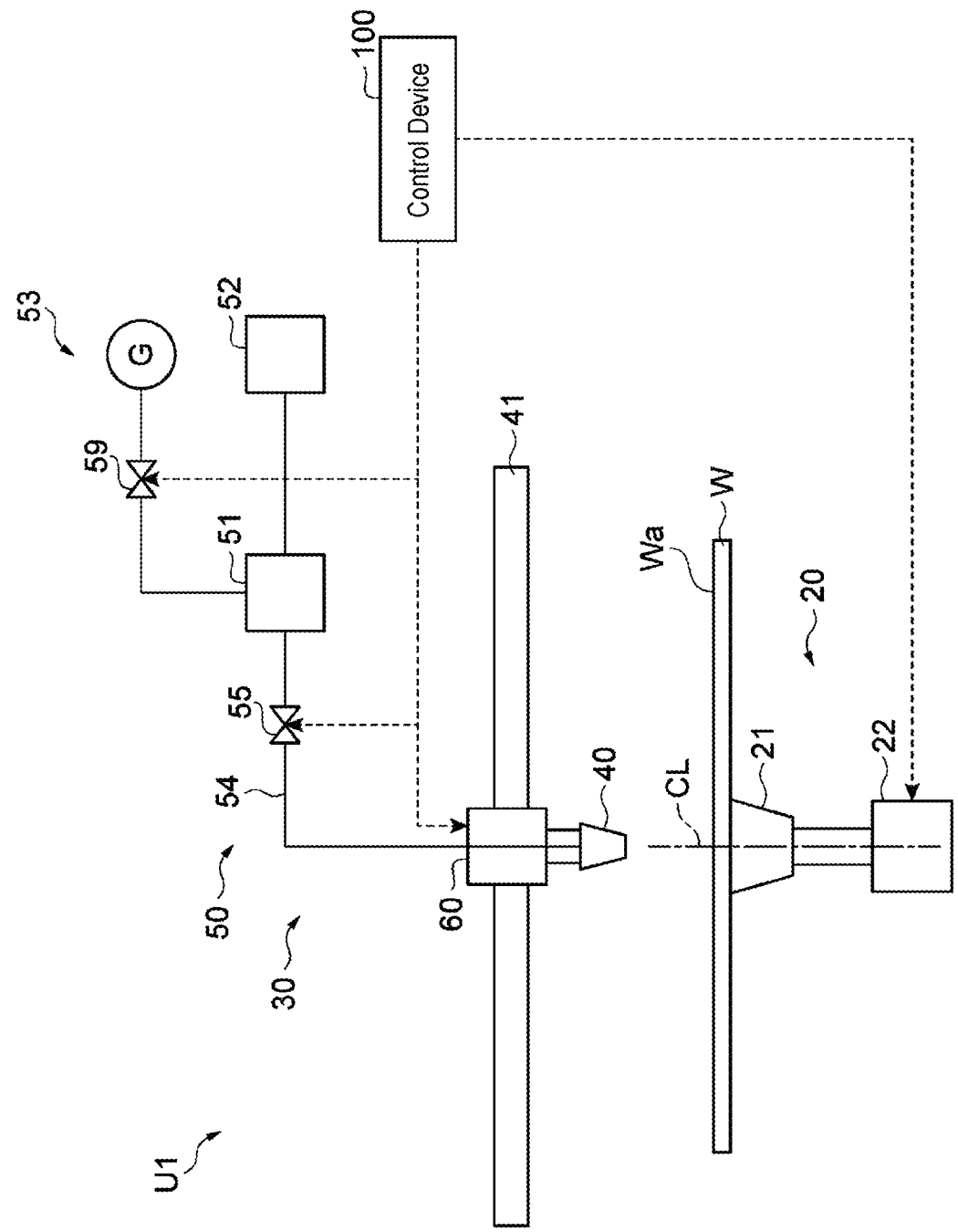
FIG. 3 is a schematic view illustrating an example of a liquid processing unit.

Next, an example of the liquid processing unit U1 will be described in detail with reference to FIG. 3. Here, the liquid processing unit U1 in the processing module 12 for forming the resist film will be described as an example. As illustrated in FIG. 3, the liquid processing unit U1 includes a rotary holder 20, a liquid supplier 30, and a driver 60.

The rotary holder 20 holds and rotates a wafer W. For example, the rotary holder 20 includes a holder 21 and a rotation driver 22. The holder 21 supports a central portion of the wafer W horizontally disposed in a state in which a surface Wa of the wafer W faces upwards, and holds the wafer W by suction (e.g., vacuum suction). The rotation driver 22 rotates the holder 21 about a vertical center axis CL using, for example, an electric motor as a driving power source, so as to rotate the wafer W.

The liquid supplier 30 supplies a processing liquid for forming a coating film (here, a resist film) on the surface Wa of the wafer W. The processing liquid may be a liquid having a high viscosity. For example, the viscosity of the processing liquid may be 300 cP (0.3 Pa·s) or more. The viscosity of the processing liquid may be 400 cP or more. Further, the viscosity of the processing liquid may be 450 cP or more. The liquid supplier 30 includes a nozzle 40, a support 41, and a liquid feeder 50, as illustrated in FIG. 3.

The nozzle 40 ejects the processing liquid toward the surface Wa of the wafer W. For example, the nozzle 40 is disposed above the wafer W held by the rotary holder 20. In addition, the nozzle 40 disposed above the wafer W ejects the processing liquid downwards in a vertical direction. The processing liquid is supplied to the surface Wa of the wafer W by ejecting the processing liquid from the nozzle 40 to the surface Wa of the wafer W. As illustrated in FIG. 3, the nozzle 40 may be held by the support 41 such that the nozzle 40 can move along the support 41 extending in a horizontal direction.

The liquid feeder 50 delivers the processing liquid to the nozzle 40. That is, the nozzle 40 ejects the processing liquid delivered from the liquid feeder 50 toward the surface Wa of the wafer W. For example, the liquid feeder 50 includes a tank 51, a liquid source 52, a pressure adjustor 53, a flow path 54, and an opening and closing valve (valve) 55.

The tank 51 temporarily stores the processing liquid replenished from the liquid source 52. The liquid source 52 is a supply source of the processing liquid. For example, the tank 51 includes a container that stores the processing liquid. The pressure adjustor 53 adjusts a pressure applied to the processing liquid in the container of the tank 51 (a pressure in the tank 51). For example, the pressure adjustor 53 includes an adjustment valve 59 and a gas source G. A gas is supplied from the gas source G into the container of the tank 51 via the adjustment valve 59. When the container of the tank 51 is filled with the gas, the interior of the container of the tank 51 is pressurized. Nitrogen gas, for example, is used as a gas supplied to the tank 51. The adjustment valve 59 is, for example, an electronic valve, and operates based on operation instructions from the control device 100. The pressure in the container of the tank 51 is adjusted by adjusting a flow rate (a flow rate per unit time) of the gas from the gas source G into the container of the tank 51 by the adjustment valve 59.

The flow path 54 connects the tank 51 and the nozzle 40 to each other. That is, the tank 51 is connected to the nozzle 40 via the flow path 54. Thus, the flow path 54 guides the processing liquid delivered from the tank 51 to the nozzle 40. The opening and closing valve 55 is provided in the flow path 54 and switches an opening state of the flow path 54 between an opened state and a closed state according to operation instructions from the control device 100. The opening and closing valve 55 is, for example, an air operation valve. In a state in which the opening and closing valve 55 is opened, the processing liquid is guided to the nozzle 40 at a flow rate corresponding to the pressure in the container of the tank 51. In other words, when the flow path 54 is in the opened state, the processing liquid is ejected from the nozzle 40 toward the surface Wa of the wafer W at the flow rate corresponding to the pressure in the container of the tank 51. In a state in which the opening and closing valve 55 is closed (the flow path 54 is closed), the processing liquid is not delivered from the tank 51 to the nozzle 40, and ejection of the processing liquid from the nozzle 40 is stopped. When receiving an instruction from the control device 100 to switch to the closed state, the opening and closing valve 55 may gradually change the flow path 54 from the opened state to the closed state. For example, the opening and closing valve 55 may gradually change the flow path 54 from the opened state to the closed state in about 0.1 seconds to several tens of seconds.

The driver 60 moves the nozzle 40 along the support 41 using an electric motor or the like as a driving power source. Specifically, the driver 60 moves the nozzle 40 in the horizontal direction between the center axis CL and a region outside the wafer W based on operation instructions from the control device 100. In other words, the driver 60 moves the nozzle 40 in the radial direction of the wafer W held by the rotary holder 20 (in a direction from the center to the peripheral portion of the wafer W) in a plan view.

(Control Device)

Next, an example of the control device 100 will be described in detail. The control device 100 controls each component of the coating and development apparatus 2. The control device 100 is configured to perform a supply control for supplying a processing liquid to the surface Wa of the wafer W to form a spiral trajectory by ejecting the processing liquid from the nozzle 40 while rotating the wafer W and moving the nozzle 40 from the center of the wafer W toward the peripheral portion of the wafer W (see also FIG. 7). Hereinafter, a trajectory of the nozzle 40 with respect to the wafer W when the processing liquid is supplied in the spiral shape will be described as a "supply trajectory."

The trajectory of the nozzle 40 may be referred to as the trajectory of the processing liquid supplied to the surface Wa of the wafer W. That is, the "supply trajectory" is the trajectory of the nozzle 40 with respect to the wafer W (more specifically, a trajectory of a center of an ejection port of the nozzle 40), and is also the trajectory of the processing liquid supplied to the surface Wa of the wafer W (more specifically, a trajectory of a center of the processing liquid supplied to the surface Wa of the wafer W). In addition, the "spiral shape" in the present embodiment is a state in which the processing liquid is spirally supplied on the surface Wa of the wafer W. For example, as the spiral shape, a so-called Archimedes spiral in which intervals between adjacent lines are equal to one another is assumed. The Archimedes spiral is a curve described by a polar equation $r=a\theta (a>0, \theta \geq 0)$.

The supply control may include a constant ejection control for supplying the processing liquid at a substantially constant flow rate, a variable control for supplying the processing liquid while gradually reducing an ejection amount per unit area in the surface Wa of the wafer W, and a closing control for gradually changing the flow path 54 from the opened state to the closed state. Details of the respective controls will be described later.

Figure 4:
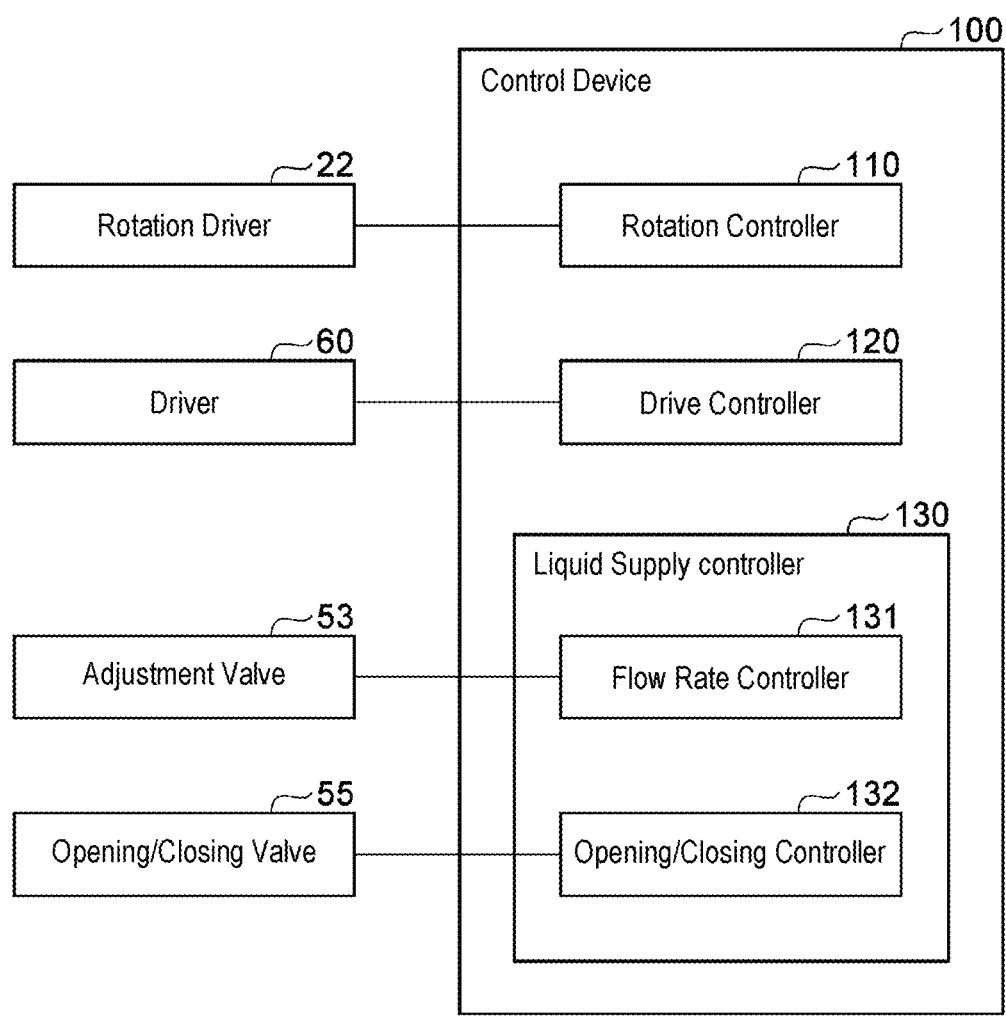
FIG. 4 is a block diagram illustrating an example of functional configuration of a control device.

As illustrated in FIG. 4, the control device 100 includes a rotation controller 110, a drive controller 120, and a liquid supply controller 130 as functional components (hereinafter, referred to as "functional modules").

The rotation controller 110 controls the rotation of the wafer W by the rotation driver 22. The rotation controller 110 may control the rotation driver 22 to rotate the wafer W at a preset rotation speed. For example, the rotation controller 110 may rotate the wafer W at a rotation speed of about 0.01 to several tens of seconds per rotation.

The drive controller 120 has a function of controlling the driver 60 to move the nozzle 40 in the horizontal direction. Specifically, the drive controller 120 controls the driver 60 to move (dispose) the nozzle 40 from the outside of the wafer W to the center of the wafer W (on the center axis CL) before the nozzle 40 starts ejecting the processing liquid. In addition, when the processing liquid is ejected from the nozzle 40, the drive controller 120 controls the driver 60 to move the nozzle 40 in a direction from the center of the wafer W toward the peripheral portion of the wafer W (hereinafter, referred to as a "radial direction").

The liquid supply controller 130 has a function of controlling the liquid supplier 30 to supply the processing liquid toward the surface Wa of the wafer W. Specifically, the liquid supply controller 130 controls the liquid supplier 30 to eject the processing liquid from the nozzle 40 in a state in which the rotation controller 110 rotates the wafer W and the drive controller 120 moves the nozzle 40 in the radial direction of the wafer W. The liquid supply controller 130 includes a flow rate controller 131 and an opening and closing controller 132.

The flow rate controller 131 has a function of adjusting a flow rate of the processing liquid ejected from the nozzle 40 by controlling the adjustment valve 59 in the constant ejection control and the variable control. The opening and closing controller 132 has a function of controlling the opening and closing valve 55 at the start of the supply control and in the closing control.

Figure 5:
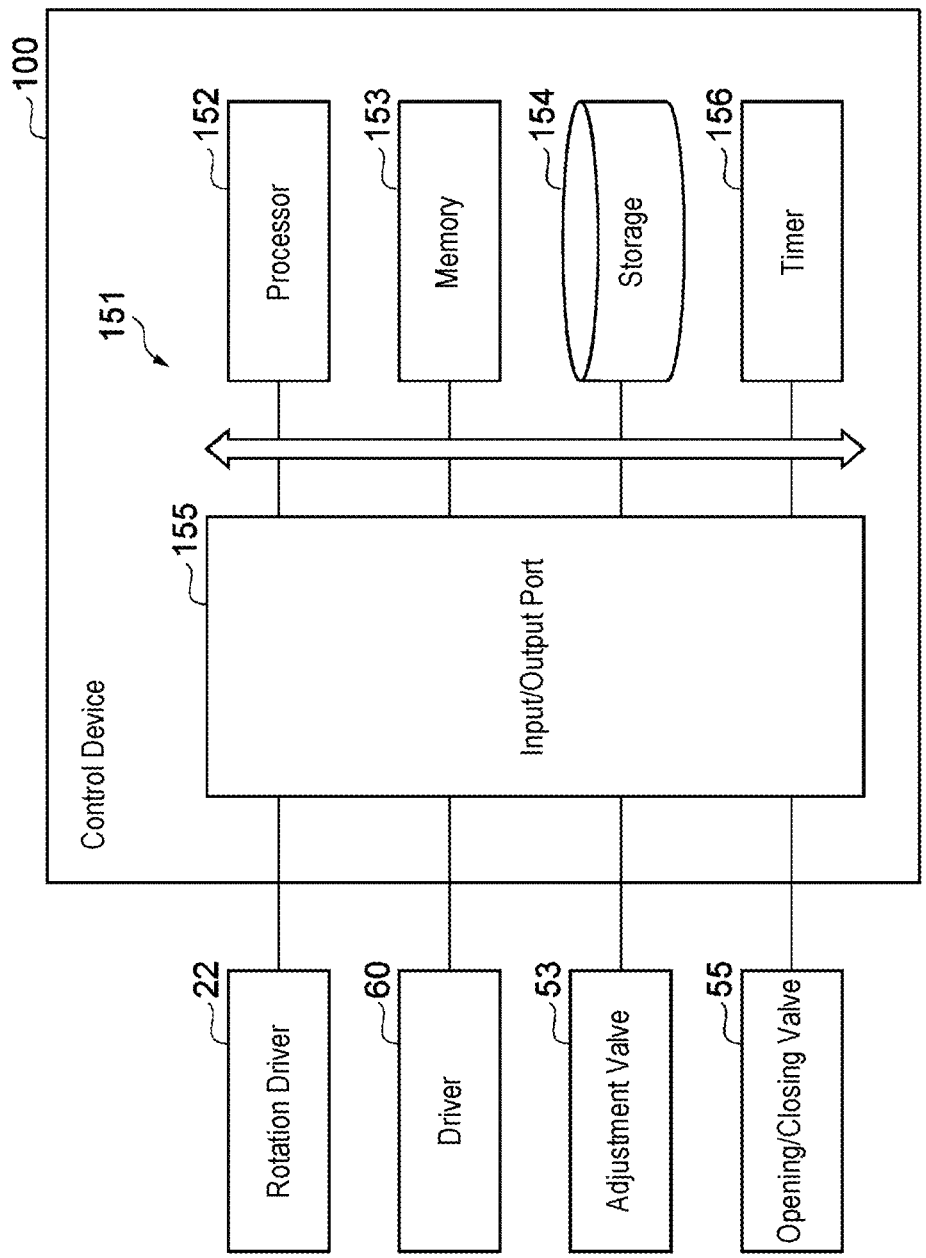
FIG. 5 is a block diagram illustrating an example of hardware configuration of the control device.

The control device 100 is configured by one or more control computers. For example, the control device 100 includes a circuit 151 illustrated in FIG. 5. The circuit 151 includes one or more processors 152, a memory 153, a storage 154, an input and output port 155, and a timer 156.

The storage 154 has a non-transitory computer-readable storage medium such as a hard disc. The storage medium stores a program for causing the control device 100 to execute a processing liquid supply procedure described later. The storage medium may be a removable medium such as a nonvolatile semiconductor memory, a magnetic disc, or an optical disc. The memory 153 temporarily stores a program loaded from the storage medium of the storage 154 and a result of arithmetic operation performed by the processor 152. The processor 152 forms the respective above-described functional modules by executing the program in cooperation with the memory 153. The timer 156 counts an elapsed time by counting, for example, reference pulses of a certain period. The input and output port 155 inputs and outputs electric signals to and from a member as a control target in response to commands from the processor 152.

The hardware configuration of the control device 100 is not necessarily limited to constituting each functional module by a program. For example, each functional module of the control device 100 may be constituted by a dedicated logic circuit or an application specific integrated circuit (ASIC) in which dedicated logic circuits are integrated.

[Processing Liquid Supply Procedure]

Figure 6:
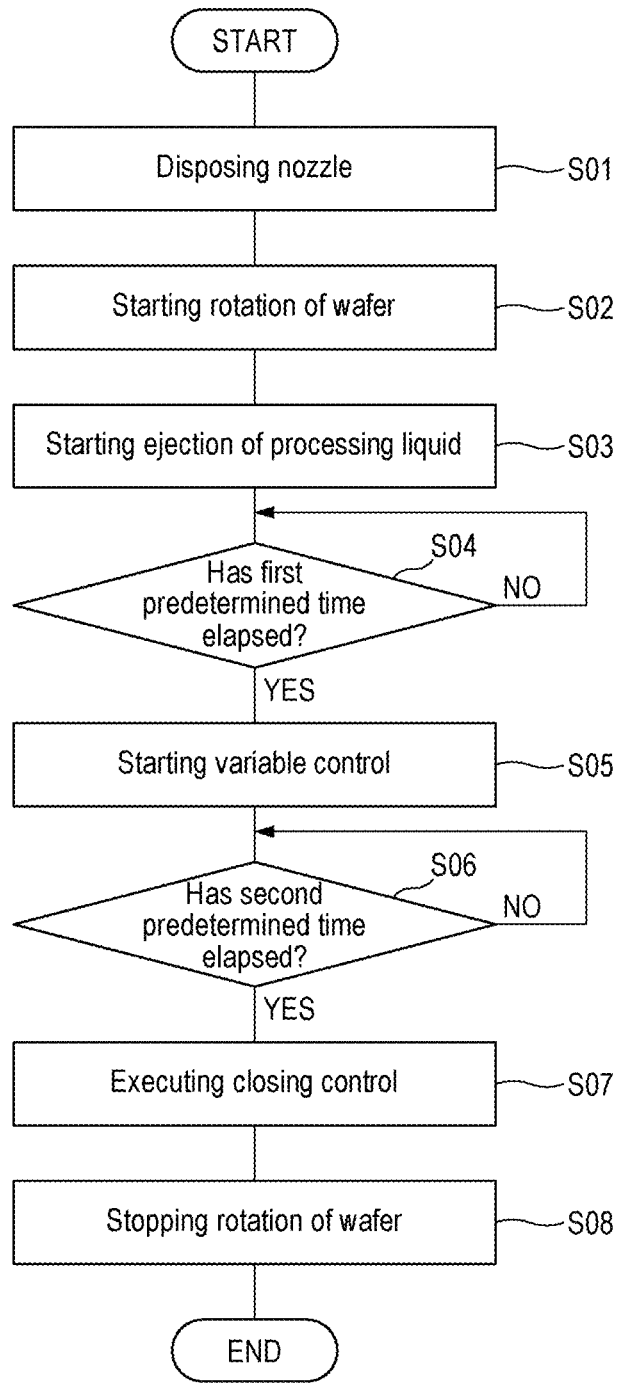
FIG. 6 is a flowchart illustrating an example of a processing liquid supply procedure.

As an example of a substrate processing method, a processing liquid supply procedure executed in the coating and development apparatus 2 will be described with reference to FIGS. 6 to 10B. Here, a processing liquid supply procedure executed in the liquid processing unit U1 of the processing module 12 will be described as an example. FIG. 6 is a flowchart illustrating an example of a processing liquid supply procedure.

In the processing liquid supply procedure, first, as illustrated in FIG. 6, the control device 100 executes step S01. In step S01, for example, the drive controller 120 controls the driver 60 to dispose the nozzle 40 on the center of the wafer W held by the holder 21 of the rotary holder 20.

Next, the control device 100 executes step S02. In step S02, for example, the rotation controller 110 starts rotating the wafer W by controlling the rotation driver 22 of the rotary holder 20. After the wafer W starts rotating, the rotation controller 110 controls the rotation driver 22 such that the wafer W rotates at a predetermined number of rotations.

Next, the control device 100 executes step S03. In step S03, the control device 100 control the liquid supplier 30 to start supplying the processing liquid to the wafer W. For example, the drive controller 120 causes the nozzle 40 to start moving in the radial direction of the wafer W, and the liquid supply controller 130 causes the nozzle 40 to start ejecting the processing liquid toward the surface Wa of the wafer W. In order to start ejecting the processing liquid, specifically, the opening and closing controller 132 of the liquid supply controller 130 controls the opening and closing valve 55 to switch the flow path 54 from the closed state to the opened state. A supply control is started by steps S02 and S03.

Figure 7:
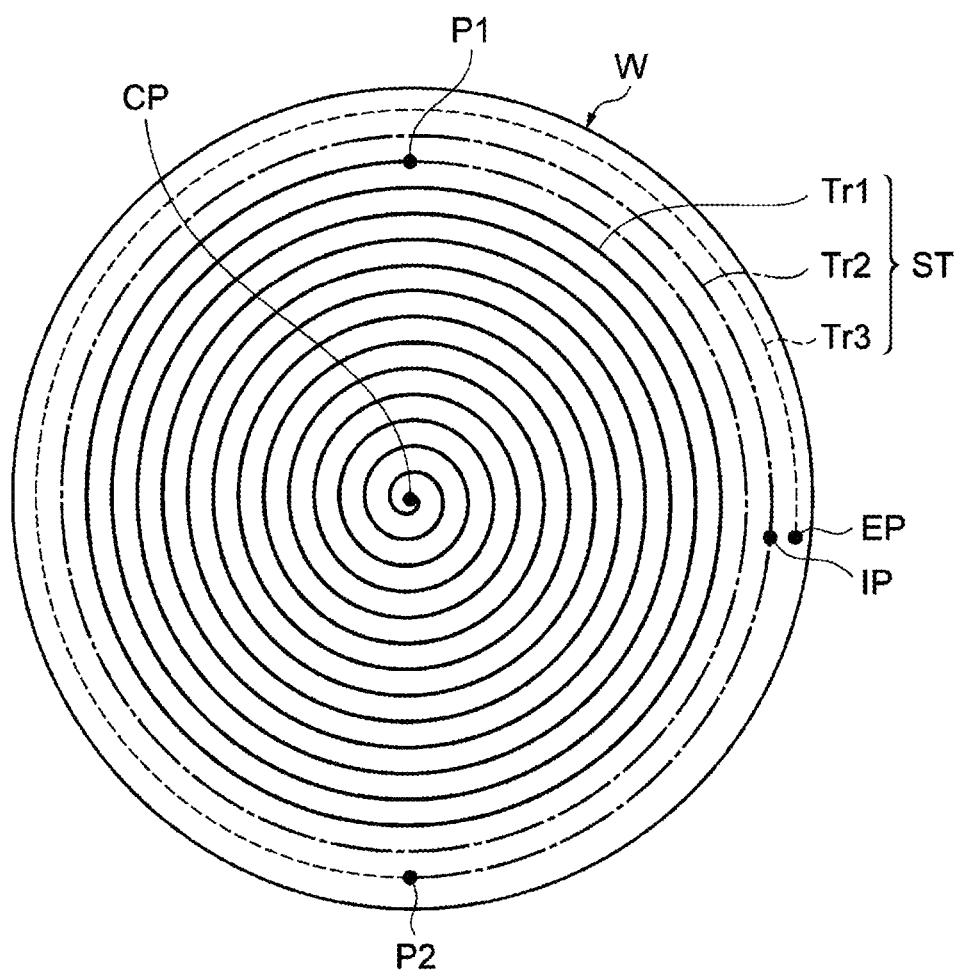
FIG. 7 is a schematic view illustrating an example of a spiral supply trajectory.

Next, the control device 100 executes step S04. In step S04, the control device 100 waits until a first predetermined time elapses from the time at which the supply of the processing liquid is started in step S03. Thus, during the first predetermined time, the processing liquid is ejected from the nozzle 40 onto the surface Wa of the wafer W in a state in which the wafer W is rotating and the nozzle 40 is moving in the radial direction of the wafer W, and is supplied in a spiral shape on the surface Wa (see FIG. 7). In FIG. 7, the supply trajectory of the processing liquid is indicated as a "trajectory ST". The trajectory ST corresponds to the trajectory of the center of the ejection port of the nozzle 40, and also corresponds to the trajectory of the center of the processing liquid supplied from the nozzle 40 to the surface Wa of the wafer W.

In the first predetermined time, the flow rate controller 131 of the liquid supply controller 130 controls the flow rate of the processing liquid delivered to the nozzle 40 such that the ejection amount of the processing liquid per unit area on the surface Wa of the wafer W along the trajectory ST from the nozzle 40 becomes substantially constant. The unit area on the surface Wa of the wafer W along the trajectory ST may be set, for example, to be an area of a region having a predetermined width centered at the trajectory ST having a predetermined length when the wafer W is viewed from above.

For example, the flow rate controller 131 may control the adjustment valve 59 during the first predetermined time to maintain the pressure in the tank 51 substantially constant such that the ejection amount of the processing liquid per unit time from the nozzle 40 becomes substantially constant. Assuming that the rotation speed of the wafer W becomes substantially constant when the ejection amount of the processing liquid per unit time from the nozzle 40 is made substantially constant, the ejection amount of the processing liquid per unit area in the surface Wa of the wafer W decreases along the trajectory ST as the nozzle 40 approaches the peripheral edge of the wafer W. For this reason, the rotation controller 110 may control the rotation driver 22 to reduce the number of rotations of the wafer W as the nozzle 40 moves outward from the center.

In addition, the drive controller 120 may control a moving speed of the nozzle 40 according to the rotation speed of the wafer W such that the interval between the trajectories ST in the radial direction of the wafer W is substantially constant. Specifically, the drive controller 120 may reduce the moving speed of the nozzle 40 according to the decrease in the number of rotations of the wafer W such that the nozzle 40 moves in the radial direction of the wafer W at a substantially constant interval per rotation. The control of the rotation speed of the wafer W and the control of the moving speed of the nozzle 40, as described above, may continue during the entire period of the supply control.

By performing steps S02 to S04, the constant ejection control for supplying the processing liquid from the nozzle 40 to the surface Wa of the wafer W at a substantially constant flow rate (ejection rate) may be performed during the first predetermined time. In the example illustrated in FIG. 7, the constant ejection control is performed in a section indicated by a trajectory Tr1 of the trajectory ST (the section from point CP to point P1).

When the first predetermined time elapses from the time at which the supply of the processing liquid is started, the control device 100 executes step S05. In step S05, the control device 100 starts the variable control. In the variable control, the control device 100 controls the liquid supplier 30 such that the ejection amount of the processing liquid per unit area along the trajectory ST is gradually reduced at least in a portion, which is included in the trajectory ST and forms the outermost periphery (a portion corresponding to the outermost periphery of the trajectory ST). The control device 100 may perform the variable control in the portion forming the outermost periphery of the trajectory ST, and may perform the variable control in a section including the portion forming the outermost periphery of the trajectory ST and a portion forming a connection portion following the outermost periphery. In the example illustrated in FIG. 7, the variable control may be performed, for example, in a section indicated by a trajectory Tr2 of the trajectory ST (the section from point P1 to point P2) and in a section indicated by a trajectory Tr3 of the trajectory ST (the section from point P2 to point EP).

The outermost periphery of the trajectory ST means, for example, a section of the trajectory ST in which no other trajectory exists outside the section in the radial direction of the wafer W (the section located on the outermost side). For example, in the example illustrated in FIG. 7, one revolution from point IP to point EP (end point) in the trajectory ST (trajectory Tr3) corresponds to the outermost periphery of the trajectory ST.

As an example of gradually reducing the ejection amount of the processing liquid per unit area on the surface Wa of the wafer W, the control device 100 may gradually reduce the ejection amount (ejection rate) of the processing liquid per unit time from the nozzle 40. For example, in the variable control, the flow rate controller 131 may gradually reduce the pressure in the tank 51 in a state in which the rotation speed of the wafer W and the moving speed of the nozzle 40 are controlled in the same manner as in the constant ejection control. In other words, in the variable control, the flow rate controller 131 may control the adjustment valve 59 to gradually reduce the pressure in the tank 51, thereby gradually reducing the ejection amount of the processing liquid per unit time from the nozzle 40. In the present specification, "gradually decrease (reduce)" includes reducing a value to be reduced (e.g., the ejection rate) substantially linearly over time and reducing the value in a stepwise manner, which includes at least two steps, over time.

Next, the control device 100 executes step S06. In step S06, the control device 100 waits until a second predetermined time elapses from the time when the execution of the variable control is started. Thus, the variable control is executed during the second predetermined time. In the example illustrated in FIG. 7, the processing liquid is supplied to the wafer W in a state in which the ejection amount of the processing liquid per unit length of the trajectory ST is gradually reduced in the trajectories Tr2.

When the second predetermined time elapses from the time when the execution of the variable control is started, the control device 100 executes step S07. In step S07, the control device 100 executes the closing control. While step S07 is being performed, the control device 100 may continue the variable control. In the closing control (Step S07), the opening and closing controller 132 controls the opening and closing valve 55 to gradually change the flow path 54 from the opened state to the closed state. During the execution of the closing control, the state in which the rotation speed of the wafer W and the moving speed of the nozzle 40 are controlled in the same manner as in the constant ejection control may be continued.

Here, transition of the flow path 54 to the closed state means, for example, stopping the ejection of the processing liquid from the nozzle 40. A time during which the flow path 54 transitions from the opened state to the closed state (hereinafter, referred to as a "transition time") may be set according to a time during which the opening and closing valve 55 transitions from the opened state to the closed state (hereinafter, "valve closing time"). The opening and closing valve 55 may transition from the opened state to the closed state during the valve closing time indicated by an operation instruction from the control device 100 (opening and closing controller 132). The transition time and the valve closing time may substantially coincide with each other, or the transition time may be shorter than the valve closing time. For example, the transition time may be about half the valve closing time.

The transition time may be set to about 0.1 second to several tens of seconds. The transition time may be set to be equal to or longer than a time required for one rotation of the wafer W in the supply control (hereinafter, referred to as "rotation time"). For example, the transition time may be set to be equal to or longer than the rotation time at the largest number of rotations in the supply control. The relationship between the rotation time and the transition time is not limited to the above example. For example, the transition time may be set to half or more of the rotation time at the largest number of rotations, or may be set to ¼ or more of the rotation time at the largest number of rotations. The upper limit of the transition time may be set according to the performance of the opening and closing valve 55. In the example illustrated in FIG. 7, the control device 100 may execute the closing control and the variable control in the section indicated by the trajectory Tr3 (the end portion) in the trajectory ST. In this case, the control device 100 may execute the closing control and the variable control on the outermost periphery of the trajectory ST.

After the opening and closing valve 55 transitions to the closed state, the control device 100 executes step S08. In step S08, the rotation controller 110 control the rotation driver 22 to stop the rotation of the wafer W. Thus, the processing liquid is supplied to one wafer W along the spiral trajectory ST. The control device 100 may cause the wafer W supplied with the processing liquid to be transferred to the heat treatment unit U2, and may cause the heat treatment unit U2 to perform a heat treatment on the wafer W. As a result, a coating film (e.g., a resist film) is formed on the wafer W using the processing liquid as a material.

Figure 8:
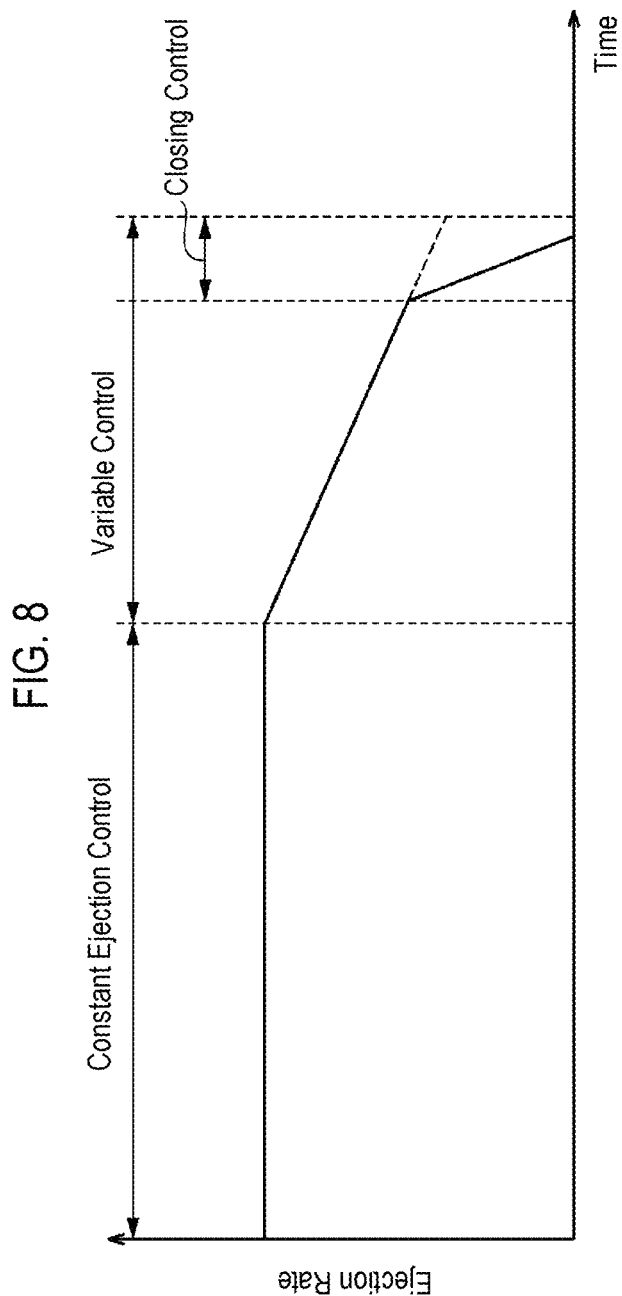
FIG. 8 is a view for explaining an example of a change in an ejection rate over time.

Steps S01 to S08 described above may be summarized as follows. As illustrated in FIG. 8, first, the control device 100 executes the constant ejection control during the first predetermined time. While the constant ejection control is executed, the ejection rate (the ejection amount per unit time) of the processing liquid ejected from the nozzle 40 may be maintained substantially constant. By supplying the processing liquid under the constant ejection control, the trajectory Tr1 as illustrated in FIG. 7 is formed. Then, the control device 100 executes the variable control during the second predetermined time. While the variable control is executed, the ejection rate of the processing liquid ejected from the nozzle 40 decreases gradually (e.g., substantially linearly). As the processing liquid is supplied under the variable control, the trajectory Tr2 as illustrated in FIG is formed. 7. The execution time of the constant ejection control may be set to be, for example, about 10 to 40 times the execution time of the variable control.

Thereafter, the control device 100 executes the closing control while continuing the variable control. While the closing control is being executed, the opening and closing valve 55 transitions to the closed state, and thus the ejection rate further decreases. In addition, during the execution of the closing control, the ejection rate becomes zero, and the ejection of the processing liquid from the nozzle 40 is stopped. As the processing liquid is supplied under the variable control and the closing control, the trajectory Tr3 illustrated in FIG. 7 is formed. As described above, with respect to one wafer W, the control device 100 may cause the processing liquid to be supplied to the portion forming the trajectory Tr1 by the constant ejection control, may cause the processing liquid to be supplied to the portion forming the trajectory Tr2 by the variable control, and may cause the processing liquid to be supplied to the portion forming the trajectory Tr3 by the variable control and the closing control.

[Effects]

In the embodiments described above, the ejection amount of the processing liquid per unit area on the surface Wa of the wafer W gradually decreases in the portion forming the outermost periphery of the trajectory ST. When the processing liquid is supplied so as to form the spiral trajectory ST from the center of the wafer W in the state in which the ejection amount of the processing liquid per unit area is maintained substantially constant, a difference in the amount of the processing liquid may occur in the circumferential direction of the wafer W in the vicinity of the outermost periphery (in the vicinity of the portion including the outermost periphery). Specifically, the interval between the peripheral edge of the wafer W and the outermost trajectory ST varies depending on the location in the circumferential direction of the wafer W centered at the point CP. In other words, the uncoated area existing between the peripheral edge of the wafer W and the trajectory ST varies depending on the location in the circumferential direction of the wafer W.

For this reason, when the processing liquid is supplied along a portion corresponding to the entire trajectory ST while maintaining the ejection amount per unit area substantially constant, a difference in the supply amount of the processing liquid in the circumferential direction occurs in the vicinity of the outermost periphery of the trajectory ST. For example, when a film thickness of a film formed using the processing liquid is measured along a circle having a radius located in the vicinity of the outermost circumference in the radial direction of the wafer W, the film thickness may vary depending on the location in the circumferential direction of the wafer W.

Figure 9A:
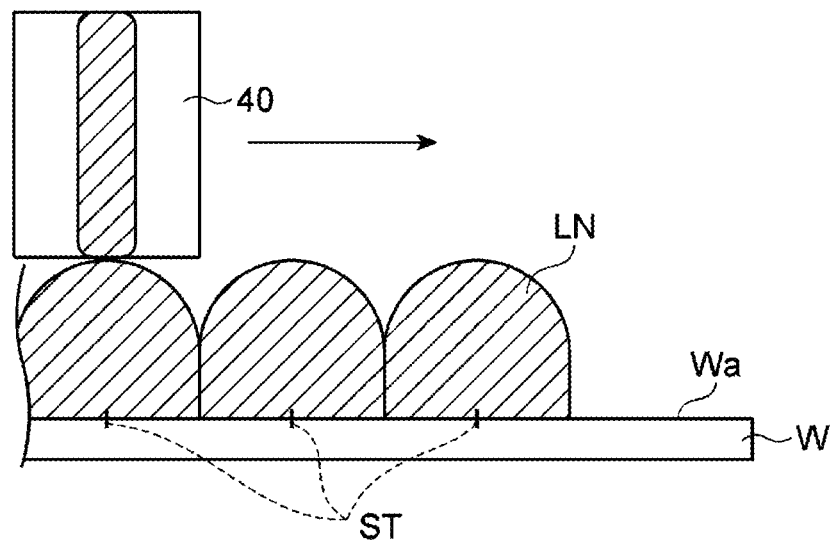
FIGS. 9A and 9B are views for explaining a decrease in an ejection amount under a variable control.
Figure 9B:
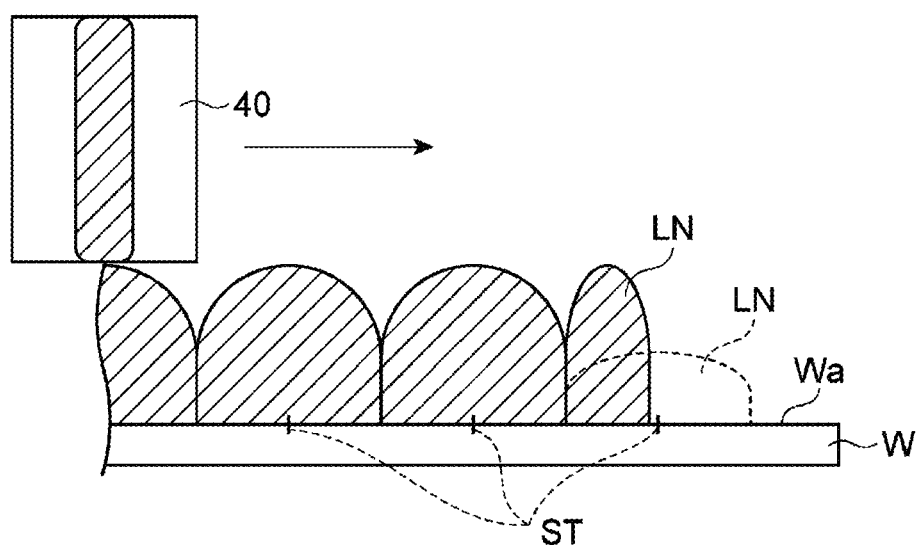

In contrast, in the embodiments described above, since the ejection amount of the processing liquid gradually decreases at the outermost periphery, the difference in the ejection amount occurring in the vicinity of the outermost periphery is reduced. With reference to FIGS. 9A and 9B, the reduction in the difference in the ejection amount will be described. FIGS. 9A and 9B schematically illustrate cross sections of ejection status of the processing liquid (cross sections in the vicinity of the outermost periphery) when the ejection amount of the processing liquid per unit area is reduced at the outermost periphery of the trajectory ST. FIG. 9A illustrates a cross section at a location where the interval between the peripheral edge of the wafer W and the trajectory ST is large (e.g., in the vicinity of point IP in FIG. 7). FIG. 9B illustrates a cross section at a location where the interval between the peripheral edge of the wafer W and the trajectory ST is small (e.g., a location advanced by about half of the circumference from point IP in FIG. 7).

As illustrated in FIGS. 9A and 9B, the amount of the processing liquid (supply liquid LN) supplied along the outermost periphery of the trajectory ST increases when the interval between the peripheral edge of the wafer W and the trajectory ST is large, and decreases when the interval between the peripheral edge of the wafer W and the trajectory ST is small. In addition, in the example illustrated in FIG. 9B, the supply liquid LN supplied at substantially constant intervals with respect to the inner trajectory ST is attracted to the supply liquid located on the inner trajectory ST by surface tension. In this way, by reducing the ejection amount of the processing liquid per unit area along the trajectory ST in the portion forming the outermost periphery of the trajectory ST, the difference in the supply amount of the processing liquid is reduced in the vicinity of the outermost periphery. As a result, since the difference in film thickness in the circumferential direction, which is caused by supplying the processing liquid in a spiral shape, is reduced at least in the vicinity of the outermost periphery, it is possible to improve thickness uniformity of the film formed on the surface Wa of the wafer W.

In the embodiments described above, when executing the variable control included in the supply control, the control device 100 gradually reduces the ejection amount of the processing liquid per unit time from the nozzle 40 at least in the portion forming the outermost periphery of the trajectory ST. In this case, since it is possible to adjust the ejection amount of the processing liquid by adjusting the flow rate (pressure) of the processing liquid delivered to the nozzle 40, it is easy to reduce the ejection amount of the processing liquid per unit area.

In the embodiments disclosed above, the liquid supplier 30 includes the flow path 54 configured to guide the processing liquid to the nozzle 40, and the opening and closing valve 55 configured to switch the flow path 54 between the opened state and the closed state. When executing the closing control included in the supply control, the control device 100 causes the flow path 54 to gradually transition from the opened state to the closed state by the opening and closing valve 55 in the portion forming the trajectory Tr3 including the end point (point EP) in the trajectory ST. The ejection rate of the processing liquid may temporarily increase with the closing of the opening and closing valve 55. For example, when the flow of the processing liquid is physically blocked in the flow path 54 by closing the opening and closing valve 55, a member of the opening and closing valve 55 for performing the physical blockage presses the processing liquid toward the nozzle 40 at the time of blocking. With the closing operation of the opening and closing valve 55, a phenomenon in which the ejection rate of the processing liquid temporarily increases may occur.

Figure 10A:
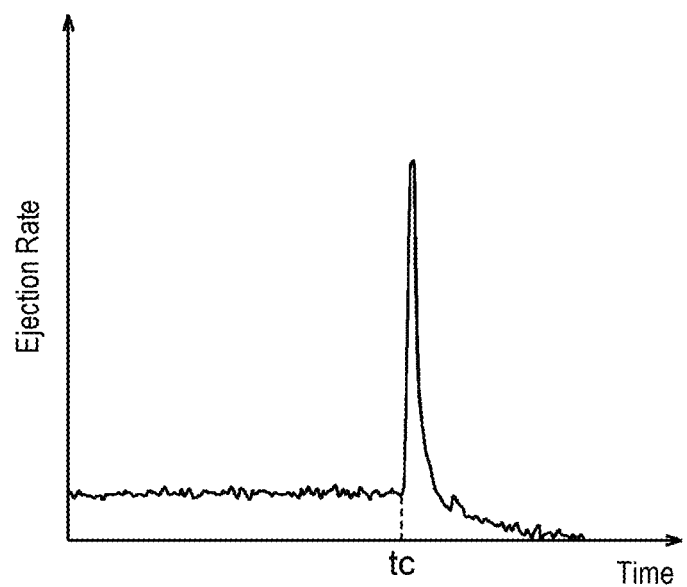
FIGS. 10A and 10B are views for explaining an increase in an ejection rate according to a closing speed of a valve.
Figure 10B:
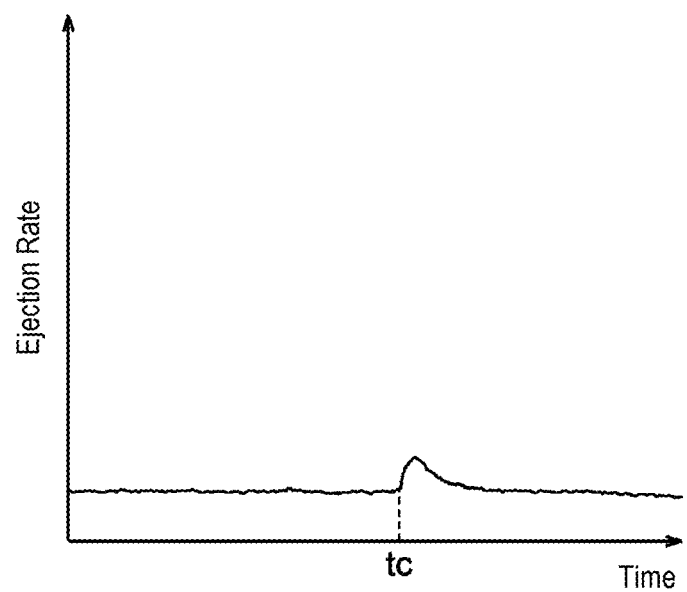

FIGS. 10A and 10B illustrate a difference in variation of an ejection rate of the processing liquid according to a closing time of the opening and closing valve 55. FIG. 10A illustrates a temporal variation of the ejection rate of the processing liquid when the opening and closing valve 55 is closed during a valve closing time (e.g., several hundred milliseconds) when the closing control is not executed. FIG. 10B illustrates a temporal variation of the ejection rate of the processing liquid when the opening and closing valve 55 is closed during a valve closing time (e.g., several tens of seconds) when the closing control is executed.

As shown in FIGS. 10A and 10B, when the valve closing time is long, a rapid increase in the ejection rate of the processing liquid following the closing operation of the opening and closing valve 55 is suppressed. That is, the amount of increase in the ejection rate immediately after time tc, at which the closing operation of the opening and closing valve 55 is started, is reduced as the valve closing time increased. As a result, it is possible to prevent the film thickness from increasing in a portion in the circumferential direction due to a rapid increase in the ejection rate of the processing liquid, and to further improve thickness uniformity of the film formed on the surface Wa of the wafer W.

In the embodiments described above, the liquid supplier 30 includes the tank 51 connected to the nozzle 40 via the flow path 54 and storing the processing liquid, and the pressure adjustor 53 configured to adjust the pressure in the tank 51. When executing the variable control, the control device 100 gradually reduces the ejection amount of the processing liquid from the nozzle 40 per unit time by gradually reducing the pressure in the tank 51 at least in the portion forming the outermost periphery of the trajectory ST. In this case, since the ejection amount of the processing liquid can be adjusted separately from the opening and closing control of the opening and closing valve 55, it is easy to gradually reduce the ejection amount. For example, with the configuration described above, the variable control and the closing control can be performed independently from each other. In addition, since the opening and closing valve 55 is located at the downstream side of the tank 51, it is possible to improve responsiveness of stopping the ejection of the processing liquid in the closing control (e.g., improvement in cutting-off the liquid).

In the embodiments described above, when executing the variable control, the control device 100 gradually reduces the ejection amount of the processing liquid from a location preceding the portion forming the outermost periphery of the trajectory ST (in the portion forming the outermost periphery and the connection portion). In this case, since the adjustment of the ejection amount of the processing liquid in the vicinity of the outermost periphery is performed from a location preceding the outermost periphery, it is possible to more reliably reduce the difference in film thickness in the circumferential direction of the wafer W at least in the vicinity of the outermost periphery.

In the embodiments described above, a viscosity of the processing liquid may be 300 cP or more. The method of supplying the processing liquid to the surface Wa of the wafer W may also include a coating method of ejecting the processing liquid to the center of the wafer W and rotating the wafer W so as to spread the ejected processing liquid on the surface Wa of the wafer W. However, when the viscosity of the processing liquid is high, it is difficult to spread the processing liquid by the rotation of the wafer W. Therefore, when the viscosity of the processing liquid is high, the method of the above-described embodiment in which the processing liquid is supplied in a spiral shape is frequently used. In other words, even when the processing liquid is supplied in a spiral shape, the amount of the processing liquid supplied to the wafer W easily affects the film thickness because movement of the processing liquid is small. In the embodiments described above, even when a processing liquid having a high viscosity is supplied in a spiral shape, it is possible to improve thickness uniformity of a film formed from the processing liquid.

[Modification]

The processing liquid supply procedure is not limited to the example described above. In the example described above, by the variable control and the closing control, the control device 100 gradually reduces the ejection amount of the processing liquid per unit area on the surface Wa of the wafer W along the trajectory ST at least in the portion forming the outermost periphery of the supply trajectory. The control device 100 may gradually reduce the ejection amount of the processing liquid per unit area along the trajectory ST at least in the portion forming the outermost trajectory ST, by executing the variable control without executing the closing control. The control device 100 may gradually reduce the ejection amount of the processing liquid per unit area along the trajectory ST at least in the portion forming the outermost periphery, by sequentially executing the variable control and the closing control (by executing the closing control after stopping the variable control).

In the variable control, the control device 100 may gradually reduce the ejection amount of the processing liquid per unit area along the trajectory ST, by gradually reducing the extent of decrease in the rotation speed of the wafer W, which is set in the constant ejection control. For example, the rotation controller 110 may gradually reduce the extent of decrease in the rotation speed of the wafer W, in a state in which the movement speed of the nozzle 40 and the ejection rate of the processing liquid are controlled by the drive controller 120 and the liquid supply controller 130, respectively, in the same manner as in the constant discharge control. Gradually reducing the extent of decrease in the rotation speed of the wafer W may include maintaining the rotation speed of the wafer W substantially constant or gradually increasing the rotation speed.

In the variable control, the control device 100 may gradually reduce the ejection amount of the processing liquid per unit area along the trajectory ST, by gradually reducing the extent of decrease in the movement speed of the nozzle 40 in the radial direction of the wafer W, which is set in the constant ejection control. For example, the drive controller 120 may gradually reduce the extent of decrease in the movement speed of the nozzle 40, in a state in which the rotation speed of the wafer W and the ejection rate of the processing liquid are controlled by the rotation controller 110 and the liquid supply controller 130, respectively, in the same manner as in the constant ejection control. Gradually reducing the extent of decrease in the movement speed of the nozzle 40 may include maintaining the movement speed of the nozzle 40 substantially constant or gradually increasing the movement speed.

In the variable control, the control device 100 may gradually reduce the ejection amount per unit length of the trajectory ST, by performing at least one of gradually reducing the ejection rate of the processing liquid from the nozzle 40 and reducing the extent of decrease in the rotation speed of the wafer W. In the variable control, the control device 100 may gradually reduce the ejection amount of the processing liquid per unit area along the trajectory ST, by performing a combination of at least two of reducing the ejection rate of the processing liquid, reducing the extent of decrease in the rotation speed of the wafer W, and reducing the extent of decrease in the movement speed of the nozzle 40. When the method of reducing the ejection rate of the processing liquid from the nozzle 40 is used, the ejection amount of the processing liquid per unit area is adjusted without controlling mechanical operations compared with the other two methods. For this reason, with the method of reducing the ejection rate of the processing liquid from the nozzle 40, it is easy to adjust the extent of decrease in the ejection amount of the processing liquid per unit area.

The liquid feeder 50 may include a pump and the opening and closing valve 55 sequentially disposed from the upstream side in the flow path connecting the liquid source 52 to the nozzle 40, without including the tank 51, the adjustment valve 59, and the gas source G. The pump may be operated based on operation instructions from the control device 100 to suction the processing liquid from the liquid source 52, and to deliver the processing liquid to the nozzle 40 via the flow path 54 and the opening and closing valve 55. The control device 100 may adjust the ejection rate of the processing liquid from the nozzle 40 by adjusting a suction force (pressure) of the pump.

According to the present disclosure, there is provided a substrate processing apparatus and a substrate processing method capable of improving thickness uniformity of a film formed on a surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
supplying a processing liquid to a surface of a substrate so as to form a supply trajectory in a spiral shape, by ejecting the processing liquid from a nozzle of a liquid supplier while rotating the substrate and moving the nozzle from a center of the substrate to a peripheral portion of the substrate,
wherein the supplying the processing liquid includes gradually reducing an ejection amount of the processing liquid per unit area on the surface of the substrate, at least in a portion forming an outermost periphery of the supply trajectory,
wherein the supplying the processing liquid further includes gradually reducing the ejection amount of the processing liquid per unit time from the nozzle, at least in the portion forming the outermost periphery.

2. The substrate processing method of claim 1, wherein the liquid supplier further includes a flow path configured to guide the processing liquid to the nozzle, and a valve configured to switch an opening state of the flow path, and
wherein the supplying the processing liquid further includes gradually changing the flow path from an opened state to a closed state by the valve, in a portion forming an end portion including an end point in the supply trajectory.

3. The substrate processing method of claim 2, wherein the liquid supplier further includes a tank connected to the nozzle via the flow path and storing the processing liquid, and a pressure adjustor configured to adjust a pressure in the tank, and
wherein the supplying the processing liquid further includes gradually reducing the ejection amount of the processing liquid per unit time from the nozzle, by gradually reducing the pressure in the tank at least in the portion forming the outermost periphery.

4. The substrate processing method of claim 3, wherein the supplying the processing liquid further includes starting the reducing the pressure in the tank before starting the changing the flow path from the opened state to the closed state by the valve.

5. The substrate processing method of claim 1, wherein the supplying the processing liquid further includes gradually reducing the ejection amount of the processing liquid per unit area on the surface of the substrate, from a location preceding the portion forming the outermost periphery of the supply trajectory.

6. The substrate processing method of claim 1, wherein the processing liquid has a viscosity of 300 cP or more.

7. A substrate processing method comprising:
supplying a processing liquid to a surface of a substrate so as to form a supply trajectory in a spiral shape, by ejecting the processing liquid from a nozzle of a liquid supplier while rotating the substrate and moving the nozzle from a center of the substrate to a peripheral portion of the substrate,
wherein the supplying the processing liquid includes gradually reducing an ejection amount of the processing liquid per unit area on the surface of the substrate, at least in a portion forming an outermost periphery of the supply trajectory,
wherein the liquid supplier further includes a flow path configured to guide the processing liquid to the nozzle, and a valve configured to switch an opening state of the flow path, and
wherein the supplying the processing liquid further includes gradually changing the flow path from an opened state to a closed state by the valve, in a portion forming an end portion including an end point in the supply trajectory.

8. The substrate processing method of claim 7, wherein the liquid supplier further includes a tank connected to the nozzle via the flow path and storing the processing liquid, and a pressure adjustor configured to adjust a pressure in the tank, and
wherein the supplying the processing liquid further includes gradually reducing the ejection amount of the processing liquid per unit time from the nozzle, by gradually reducing the pressure in the tank at least in the portion forming the outermost periphery.

9. The substrate processing method of claim 8, wherein the supplying the processing liquid further includes starting the reducing the pressure in the tank before starting the changing the flow path from the opened state to the closed state by the valve.

10. The substrate processing method of claim 7, wherein the supplying the processing liquid further includes gradually reducing the ejection amount of the processing liquid per unit area on the surface of the substrate, from a location preceding the portion forming the outermost periphery of the supply trajectory.

11. The substrate processing method of claim 7, wherein the processing liquid has a viscosity of 300 cP or more.

* * * * *